United States Patent
Hishiya et al.

(10) Patent No.: US 11,725,281 B2
(45) Date of Patent: Aug. 15, 2023

(54) GAS INTRODUCTION STRUCTURE, THERMAL PROCESSING APPARATUS AND GAS SUPPLY METHOD

(71) Applicant: TOKYO ELECTRON LIMITED, Tokyo (JP)

(72) Inventors: Shingo Hishiya, Nirasaki (JP); Sung Duk Son, Gyeonggi-do (KR); Masayuki Kitamura, Nirasaki (JP); Satoru Ogawa, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 3 days.

(21) Appl. No.: 16/909,246

(22) Filed: Jun. 23, 2020

(65) Prior Publication Data

US 2020/0407848 A1 Dec. 31, 2020

(30) Foreign Application Priority Data

Jun. 25, 2019 (JP) .................. 2019-117362

(51) Int. Cl.
| | |
|---|---|
| *C23C 16/40* | (2006.01) |
| *C23C 16/455* | (2006.01) |
| *C23C 16/22* | (2006.01) |
| *H01L 21/285* | (2006.01) |
| *H01L 21/67* | (2006.01) |
| *C23C 16/44* | (2006.01) |

(52) U.S. Cl.
CPC ........ *C23C 16/45563* (2013.01); *C23C 16/22* (2013.01); *C23C 16/4412* (2013.01); *H01L 21/28562* (2013.01); *H01L 21/67098* (2013.01)

(58) Field of Classification Search
CPC .............. C23C 16/45563; C23C 16/22; C23C 16/4412; C23C 16/45574; C23C 16/45578; C23C 16/455; C23C 16/45546; C23C 16/45561; C23C 16/4584; H01L 21/28562; H01L 21/67098; H01L 21/67017; H01L 21/67109
USPC ................ 118/715, 724; 156/345.33, 345.37
See application file for complete search history.

(56) References Cited

U.S. PATENT DOCUMENTS

2001/0003271 A1* 6/2001 Otsuki .............. C23C 16/45561
156/914
2012/0315767 A1* 12/2012 Sasaki .................. C23C 16/325
438/758

(Continued)

FOREIGN PATENT DOCUMENTS

| JP | h03-142823 A | 6/1991 |
|---|---|---|
| JP | 2008-205151 A | 9/2008 |

(Continued)

*Primary Examiner* — Rudy Zervigon
(74) *Attorney, Agent, or Firm* — Nath, Goldberg & Meyer; Jerald L. Meyer; Tanya E. Harkins

(57) ABSTRACT

A gas introduction structure for supplying a processing gas into a vertically-elongated processing container, includes a processing gas supply pipe extending along a longitudinal direction of the processing container in the processing container and having a plurality of gas discharge holes formed along the longitudinal direction, the processing gas supply pipe configured so that the processing gas is introduced from one end toward the other end thereof, wherein a dilution gas is supplied to a portion of the processing gas supply pipe that is closer to the other end than the one end of the processing gas supply pipe.

12 Claims, 16 Drawing Sheets

(56) References Cited

U.S. PATENT DOCUMENTS

| | | | | |
|---|---|---|---|---|
| 2014/0144380 A1* | 5/2014 | Kang | ............... | C23C 16/45578 |
| | | | | 118/712 |
| 2015/0275369 A1* | 10/2015 | Terada | ................... | C30B 31/16 |
| | | | | 118/715 |
| 2017/0253971 A1* | 9/2017 | Kawamorita | ..... | C23C 16/45551 |
| 2019/0096738 A1* | 3/2019 | Okajima | ........... | H01L 21/67109 |
| 2019/0318945 A1* | 10/2019 | Takagi | ............. | H01L 21/67109 |
| 2020/0407848 A1* | 12/2020 | Hishiya | ............. | C23C 16/45574 |
| 2021/0246554 A1* | 8/2021 | Shimada | ................. | C23C 16/52 |

FOREIGN PATENT DOCUMENTS

| | | |
|---|---|---|
| JP | 2011-54590 A | 3/2011 |
| JP | 2014063959 A | 4/2014 |

\* cited by examiner

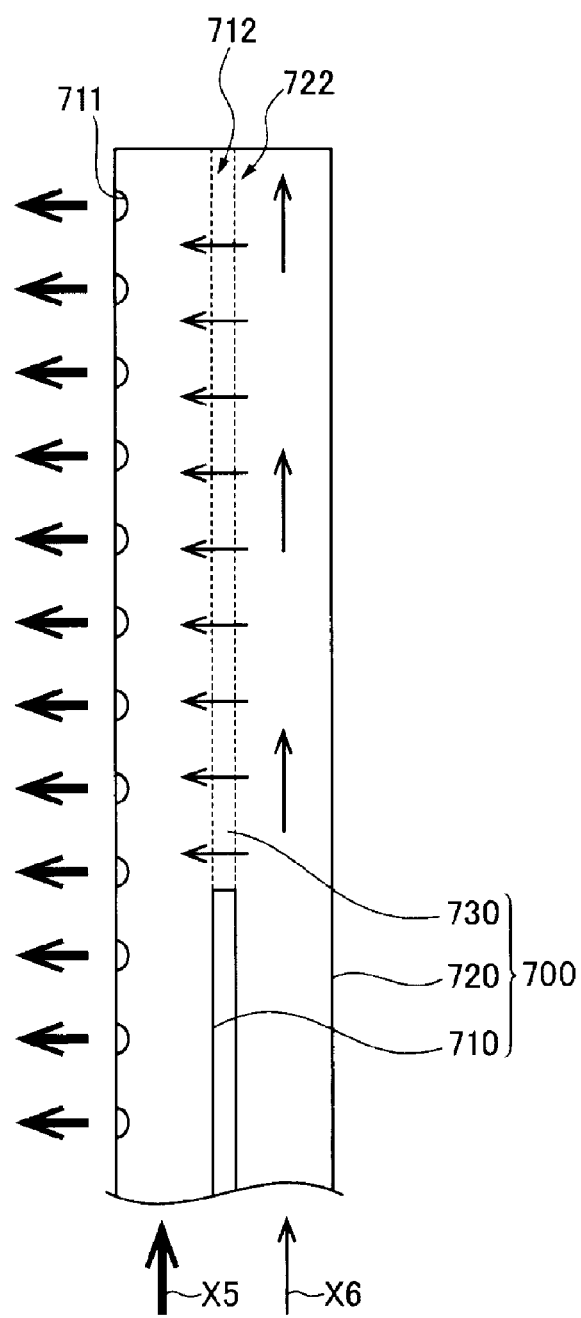

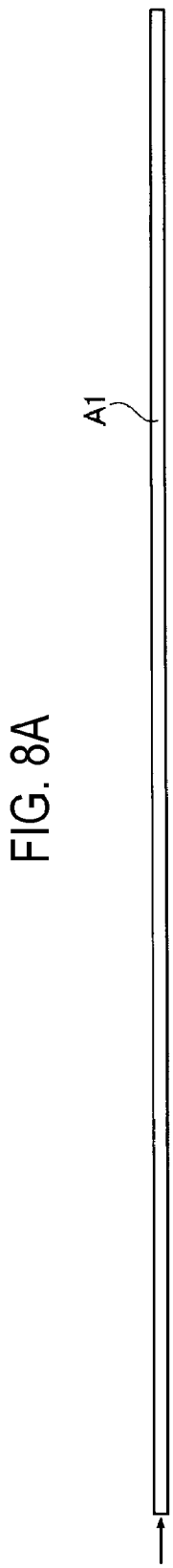

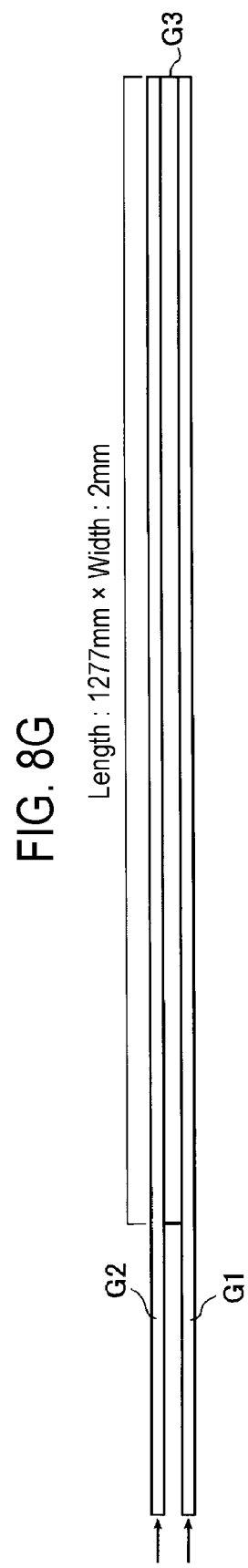

GAS INTRODUCTION STRUCTURE, THERMAL PROCESSING APPARATUS AND GAS SUPPLY METHOD

CROSS-REFERENCE TO RELATED APPLICATION

This application is based upon and claims the benefit of priority from Japanese Patent Application No. 2019-117362, filed on Jun. 25, 2019, the entire contents of which are incorporated herein by reference.

TECHNICAL FIELD

The present disclosure relates to a gas introduction structure, a thermal processing apparatus and a gas supply method.

BACKGROUND

A thermal processing apparatus is known in which a large number of wafers loaded to a wafer boat are accommodated in a vertically elongated processing container, and a processing gas is supplied in a horizontal direction from gas discharge holes formed in a gas supply portion extending along a longitudinal direction in the processing container to form a film on a wafer surface (see, e.g., Patent Document 1). In this thermal processing apparatus, a gas supply portion is used in which the total opening ratio of the gas discharge holes formed in a region where dummy substrates are arranged is set higher than the total opening ratio of the gas discharge holes formed in a region where product substrates are arranged.

PRIOR ART DOCUMENT

[Patent Document]
(Patent Document 1) Japanese Patent Application Publication No. 2014-63959

SUMMARY

According to one embodiment of the present disclosure, there is provided a gas introduction structure for supplying a processing gas into a vertically-elongated processing container, including: a processing gas supply pipe extending along a longitudinal direction of the processing container in the processing container and having a plurality of gas discharge holes formed along the longitudinal direction, the processing gas supply pipe configured so that the processing gas is introduced from one end toward the other end of the processing gas supply pipe, wherein a dilution gas is supplied to a portion of the processing gas supply pipe that is closer to the other end than the one end of the processing gas supply pipe.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 7 is a schematic diagram showing a further example of the gas introduction structure.

FIGS. 8A to 8G are views for explaining gas introduction structures used in simulation experiments.

DETAILED DESCRIPTION

Figure 1:
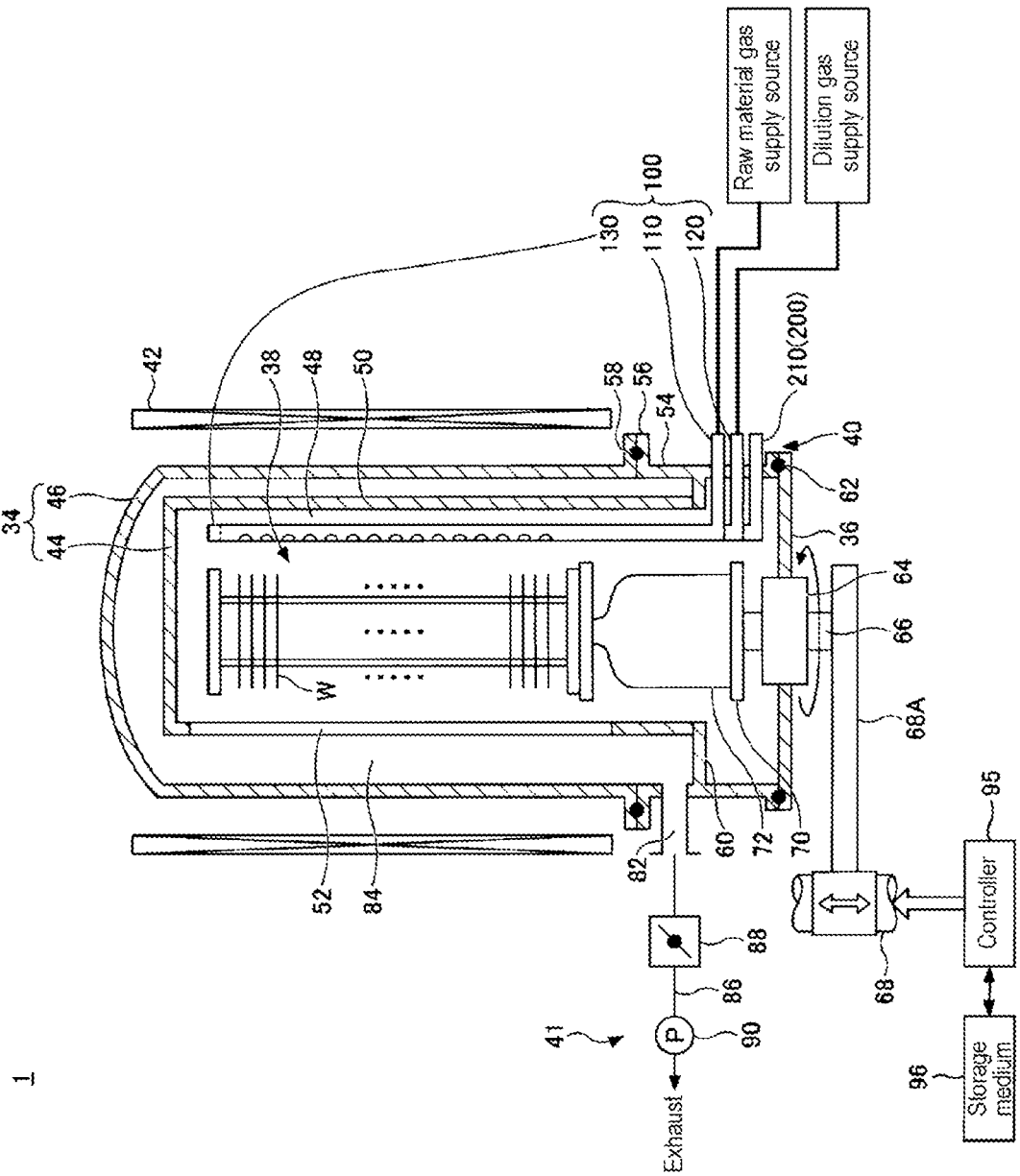
FIG. 1 is a vertical sectional view showing a configuration example of a thermal processing apparatus.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, non-limiting exemplary embodiments of the present disclosure will be described with reference to the accompanying drawings. Throughout the accompanying drawings, the same or corresponding members or parts will be denoted by the same or corresponding reference numerals, and redundant description thereof will be omitted.

[Film-Forming Apparatus]

Figure 2:
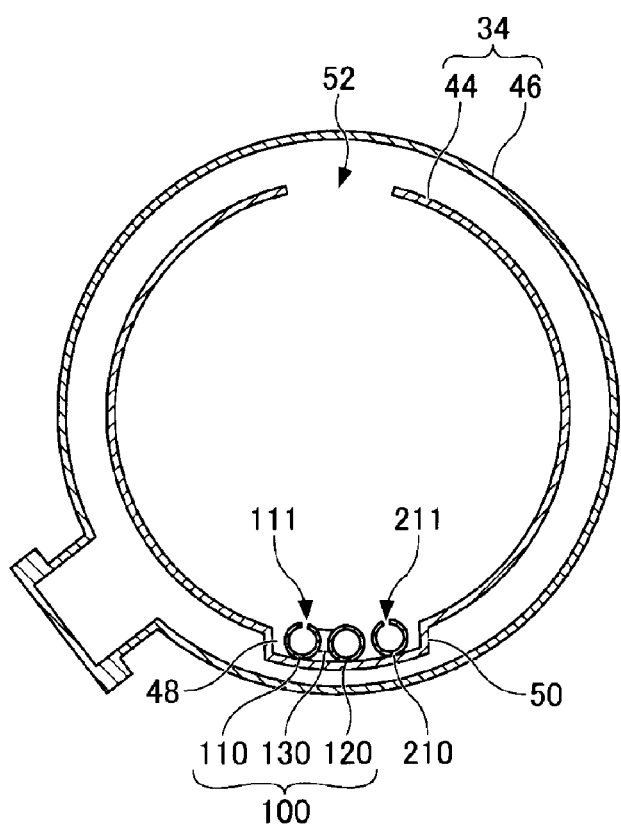
FIG. 2 is a horizontal sectional view showing the configuration example of the thermal processing apparatus.

A film-forming apparatus according to one embodiment will be described with reference to FIGS. 1 and 2. FIGS. 1 and 2 are a vertical sectional view and a horizontal sectional view, respectively, showing a configuration example of a thermal processing apparatus.

As shown in FIG. 1, the thermal processing apparatus 1 includes a processing container 34, a lid 36, a wafer boat 38, a gas supply 40, an exhauster 41 and a heater 42.

The processing container 34 is a vertically elongated container that accommodates the wafer boat 38. The wafer boat 38 is a substrate holder that holds a large number of semiconductor wafers (hereinafter referred to as "wafers W") in a shelf shape at predetermined intervals in the vertical direction. The processing container 34 includes a cylindrical inner tube 44 provided with a ceiling and an open lower end, and a cylindrical outer tube 46 provided with a ceiling and an open lower end and configured to cover the outside of the inner tube 44. The inner tube 44 and the outer tube 46 are made of a heat resistant material such as quartz or the like and are coaxially arranged to have a double-tube structure.

The ceiling of the inner pipe 44 is, for example, flat. A nozzle accommodation portion 48 for accommodating a gas supply pipe is formed on one side of the inner tube 44 so as to extend along the longitudinal direction (vertical direction) thereof. For example, as shown in FIG. 2, a portion of the side wall of the inner tube 44 is caused to protrude outward so as to form a convex portion 50, and the inside of the convex portion 50 is formed as a nozzle accommodation portion 48. A rectangular opening 52 is formed in the side wall of the inner tube 44 opposite to the nozzle accommodation portion 48 so as to extend along the longitudinal direction (vertical direction) thereof.

The opening 52 is a gas exhaust port formed so that a gas in the inner tube 44 can be exhausted through the opening 52. The opening 52 is formed to extend in the vertical direction so that the length of the opening 52 is equal to or longer than the length of the wafer boat 38.

The lower end of the processing container 34 is supported by a cylindrical manifold 54 made of, for example, stainless steel. A flange portion 56 is formed at the upper end of the manifold 54, and the lower end of the outer tube 46 is installed and supported on the flange portion 56. A seal member 58 such as an O-ring or the like is interposed between the flange portion 56 and the lower end of the outer tube 46 to keep the outer tube 46 airtight.

An annular support portion 60 is provided on the inner wall of the upper portion of the manifold 54, and the lower end of the inner tube 44 is installed and supported on the support portion 60. The lid 36 is airtightly attached to the lower end opening of the manifold 54 via a seal member 62 such as an O-ring or the like so as to airtightly close the lower end opening of the processing container 34, i.e., the opening of the manifold 54. The lid 36 is made of, for example, stainless steel.

A rotary shaft 66 is provided at the central portion of the lid 36 via a magnetic fluid seal portion 64 so as to penetrate through the lid 36. A lower portion of the rotary shaft 66 is rotatably supported by an arm 68A of an elevating part 68 including a boat elevator.

A rotary plate 70 is provided at the upper end of the rotary shaft 66, and the wafer boat 38 for holding the wafers W is mounted on the rotary plate 70 via a quartz-made heat insulating base 72. Therefore, the lid 36 and the wafer boat 38 are integrally moved up and down by raising or lowering the elevating part 68, so that the wafer boat 38 can be inserted into and removed from the processing container 34.

The gas supply 40 is provided at the manifold 54 to supply gases into the inner tube 44. The gas supply 40 includes a raw material gas supply 100 and a reaction gas supply 200.

The raw material gas supply 100 supplies a raw material gas into the inner tube 44. The raw material gas supply 100 includes a raw material gas supply pipe 110, a dilution gas supply pipe 120, and a connection pipe 130 that connects the raw material gas supply pipe 110 and the dilution gas supply pipe 120.

A raw material gas supplied from a raw material gas supply source is introduced into the raw material gas supply pipe 110. The raw material gas supply pipe 110 is provided in the inner tube 44 so as to extend along the longitudinal direction thereof. The lower end of the raw material gas supply pipe 110 is bent in an L shape and is supported so as to penetrate the manifold 54. A plurality of gas discharge holes 111 is formed in the raw material gas supply pipe 110 at predetermined intervals along the longitudinal direction thereof. The gas discharge holes 111 are configured to discharge the raw material gas in the horizontal direction. Thus, the raw material gas is supplied substantially parallel to the main surfaces of the wafers W. For example, the predetermined intervals of the gas discharge holes 111 are set to be equal to the interval between the wafers W supported by the wafer boat 38. Furthermore, the position of each of the gas discharge holes 111 in the height direction is set so that each of the gas discharge holes 111 is located in the middle between the wafers W vertically adjacent to each other, whereby the raw material gas can be efficiently supplied to the spaces between the wafers W. The raw material gas is a gas used for film formation performed by, for example, an atomic layer deposition (ALD) method or a chemical vapor deposition (CVD) method. Examples of the raw material gas include a silicon raw material gas, a metal raw material gas and the like. The raw material gas is introduced through the raw material gas supply pipe 110 into the processing container 34 heated by the heater 42 to, for example, a temperature equal to or higher than the thermal decomposition temperature of the raw material gas.

A dilution gas is supplied from a dilution gas supply source into the dilution gas supply pipe 120. The dilution gas supply pipe 120 is provided in the inner tube 44 along the longitudinal direction thereof. The lower end of the dilution gas supply pipe 120 is bent in an L shape and is supported so as to penetrate the manifold 54. The dilution gas supply pipe 120 is configured to supply the dilution gas to the raw material gas supply pipe 110 via the connection pipe 130. The dilution gas is a gas used to dilute the raw material gas. Examples of the dilution gas include an inert gas such as a nitrogen gas ($N_2$), an Ar gas or the like, a hydrogen gas ($H_2$), and the like. The details of the raw material gas supply 100 will be described later.

The reaction gas supply 200 is configured to supply a reaction gas into the inner tube 44. The reaction gas supply 200 includes a reaction gas supply pipe 210. The reaction gas supply pipe 210 is provided in the inner tube 44 along the longitudinal direction thereof. The lower end of the reaction gas supply pipe 210 is bent into an L shape and is supported so as to penetrate the manifold 54. A plurality of gas discharge holes 211 is formed in the reaction gas supply pipe 210 at predetermined intervals along the longitudinal direction thereof. The gas discharge holes 211 are configured to discharge the reaction gas in the horizontal direction. Thus, the reaction gas is supplied substantially parallel to the main surfaces of the wafers W. The predetermined intervals of the gas discharge holes 211 are set to be equal to the interval between the wafers W supported by the wafer boat 38. Furthermore, the position of each of the gas discharge holes 211 in the height direction is set so that each of the gas discharge holes 211 is located in the middle between the wafers W vertically adjacent to each other, whereby the reaction gas can be efficiently supplied to the spaces between the wafers W. The reaction gas is a gas that reacts with the raw material gas to oxidize or nitride the raw material. Examples of the reaction gas include an oxidizing gas, a nitriding gas and the like.

A gas outlet 82 is formed on the upper side wall of the manifold 54 above the support portion 60 so that the gas in the inner tube 44 discharged from the opening 52 via the space portion 84 between the inner tube 44 and the outer tube 46 can be exhausted through the gas outlet 82. The exhauster 41 is provided at the gas outlet 82. The exhauster 41 includes an exhaust passage 86 connected to the gas outlet 82. A pressure regulation valve 88 and a vacuum pump 90 are sequentially provided in the exhaust passage 86 to evacuate the inside of the processing container 34.

A cylindrical heater 42 is provided on the outer peripheral side of the outer tube 46 so as to cover the outer tube 46. The heater 42 is, for example, a heater configured to heat the wafers W accommodated in the processing container 34.

The overall operation of the thermal processing apparatus 1 is controlled by a controller 95. The controller 95 may be, for example, a computer or the like. A computer program that performs the overall operation of the thermal processing apparatus 1 is stored in a storage medium 96. The storage medium 96 may be, for example, a flexible disk, a compact disk, a hard disk, a flash memory, a DVD or the like.

[Raw Material Gas Supply]

Figure 3:
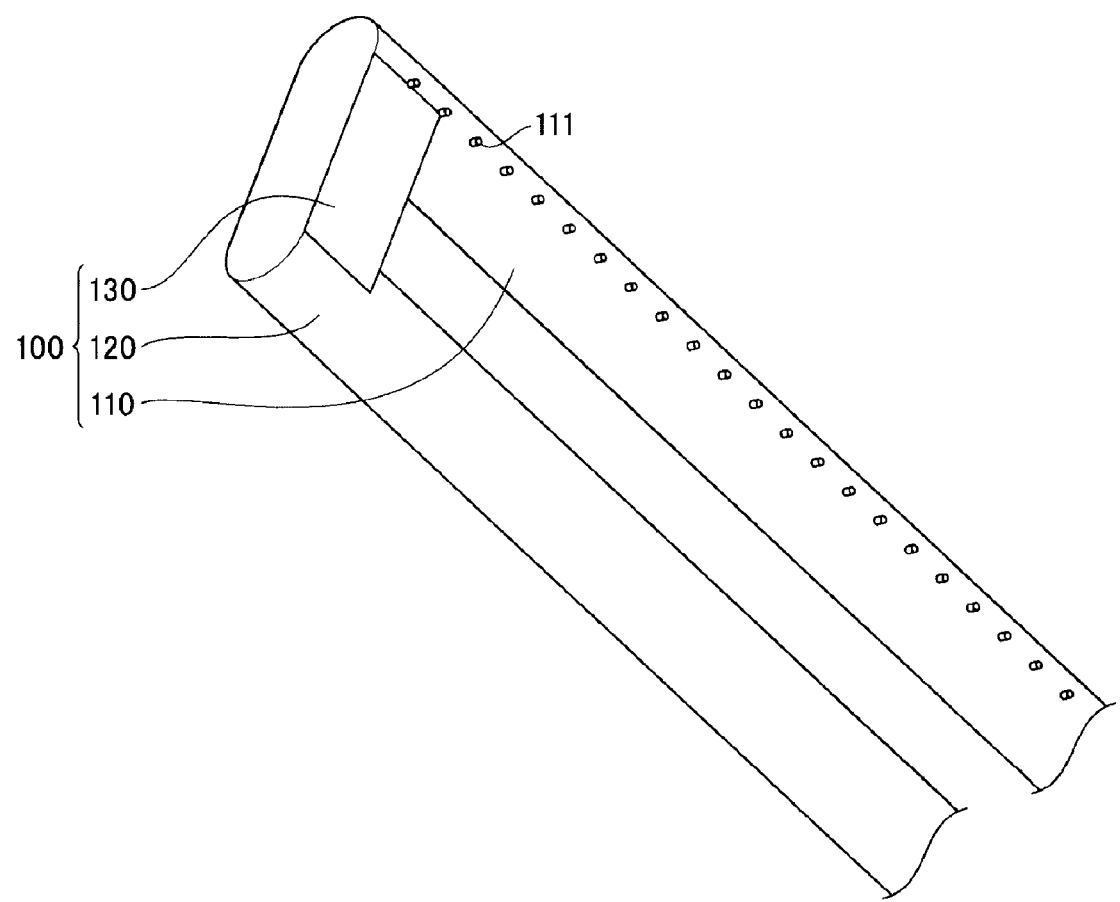
FIG. 3 is a perspective view showing an example of a gas introduction structure.
Figure 4:
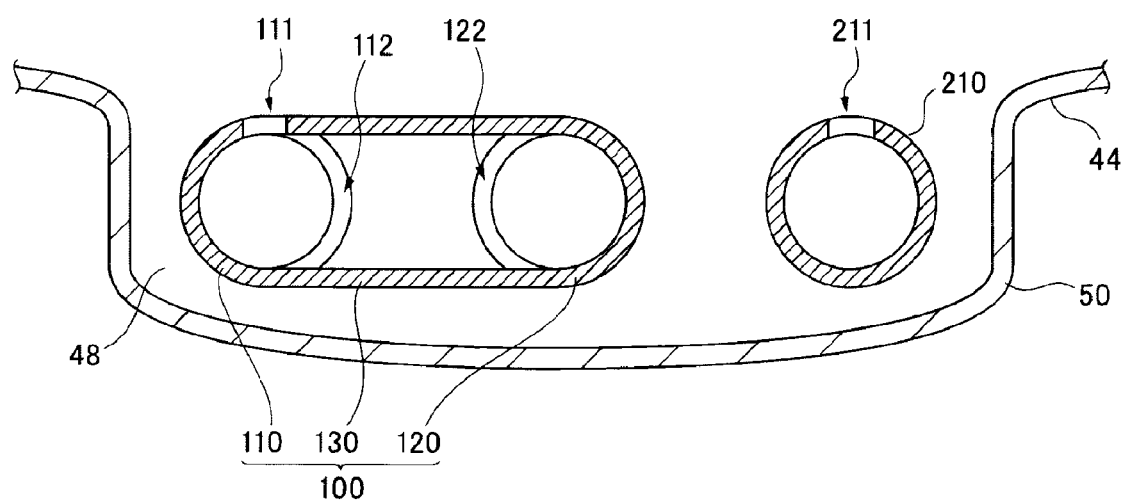
FIG. 4 is a sectional view showing the example of the gas introduction structure.
Figure 5:
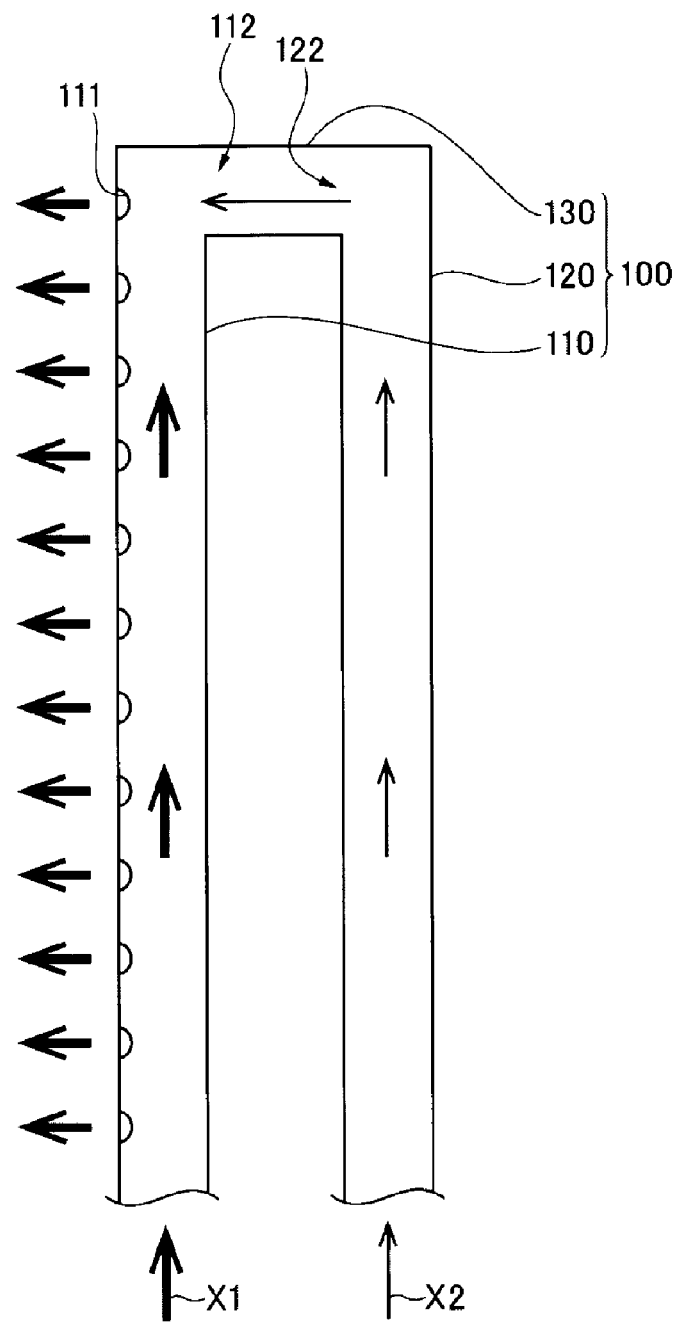
FIG. 5 is a schematic diagram showing the example of the gas introduction structure.

An example of the raw material gas supply used in the thermal processing apparatus 1 will be described with reference to FIGS. 3 to 5. FIGS. 3, 4 and 5 are a perspective view, a sectional view and a schematic diagram, respectively, showing an example of a gas introduction structure.

The raw material gas supply 100 includes a raw material gas supply pipe 110, a dilution gas supply pipe 120 and a connection pipe 130.

The raw material gas supply pipe 110 is a nozzle that supplies a processing gas into the inner tube 44, and is provided in the inner tube 44 to extend along the longitudinal direction thereof. The raw material gas is introduced into the raw material gas supply pipe 110 from the lower end toward the upper end as indicated by an arrow X1 in FIG. 5. The raw material gas supply pipe 110 has a plurality of gas discharge holes 111 and a connection port 112.

The gas discharge holes 111 are formed at predetermined intervals along the longitudinal direction of the inner tube 44. When the raw material gas is introduced into the raw material gas supply pipe 110, the gas discharge holes 111 horizontally discharge the raw material gas into the inner tube 44.

The connection port 112 is an opening formed in an upper portion of the raw material gas supply pipe 110 at a position facing the dilution gas supply pipe 120. The connection port 112 is formed, for example, in a circular shape. One end of the connection pipe 130 is connected to the connection port 112.

The dilution gas supply pipe 120 is a nozzle that supplies the dilution gas to the raw material gas supply pipe 110, and is provided inside the inner tube 44 to extend along the longitudinal direction thereof. For example, the dilution gas supply pipe 120 is arranged side by side with respect to the raw material gas supply pipe 110 along the circumferential direction of the inner tube 44. The dilution gas is introduced into the dilution gas supply pipe 120 from the lower end toward the upper end as indicated by an arrow X2 in FIG. 5. The dilution gas supply pipe 120 has a connection port 122.

The connection port 122 is an opening formed in the upper portion of the dilution gas supply pipe 120 at a position facing the raw material gas supply pipe 110. The other end of the connection pipe 130 is connected to the connection port 122.

The connection pipe 130 is a tubular member that connects the upper portion of the raw material gas supply pipe 110 and the upper portion of the dilution gas supply pipe 120, and brings the inside of the raw material gas supply pipe 110 to be communicated with the inside of the dilution gas supply pipe 120. The connection pipe 130 has one end connected to the connection port 112 and the other end connected to the connection port 122.

By the raw material gas supply 100, the dilution gas is supplied to at least the upper portion of the raw material gas supply pipe 110 from the dilution gas supply pipe 120 through the connection pipe 130. Therefore, the staying of the raw material gas in the upper portion of the raw material gas supply pipe 110 is suppressed. This makes it possible to suppress deposition of a film inside the raw material gas supply pipe 110. As a result, it is possible to reduce generation of particles due to film peeling inside the raw material gas supply pipe 110. Furthermore, by suppressing the staying of the raw material gas in the upper portion of the raw material gas supply pipe 110, it is possible to reduce the concentration of the raw material gas in the upper portion of the raw material gas supply pipe 110. As a result, the variation in the concentration of the raw material gas in a range from the upper portion to the lower portion of the raw material gas supply pipe 110 is reduced, whereby the gas can be uniformly supplied from the gas discharge holes 111.

In FIGS. 3 to 5, there is illustrated a case where the connection pipe 130 connects the upper portion of the raw material gas supply pipe 110 with the upper portion of the dilution gas supply pipe 120. However, the present disclosure is not limited thereto. The connection pipe 130 may be provided so as to connect at least a portion of the raw material gas supply pipe 110 that is closer to the upper end than the lower end of the raw material gas supply pipe 110 with the dilution gas supply pipe 120. For example, the connection pipe 130 may connect a position on the portion at the lower end of the raw material gas supply pipe 110 by a predetermined distance from the upper end of the raw material gas supply pipe 110 with a position on the portion at the lower end of the dilution gas supply pipe 120 by a predetermined distance from the upper end of the dilution gas supply pipe 120.

Furthermore, in FIGS. 3 to 5, there is illustrated a case where the raw material gas supply pipe 110, the dilution gas supply pipe 120 and the connection pipe 130 are configured as separate bodies. However, the present disclosure is not limited thereto. For example, the raw material gas supply pipe 110, the dilution gas supply pipe 120 and the connection pipe 130 may be configured as a single body.

Figure 6:
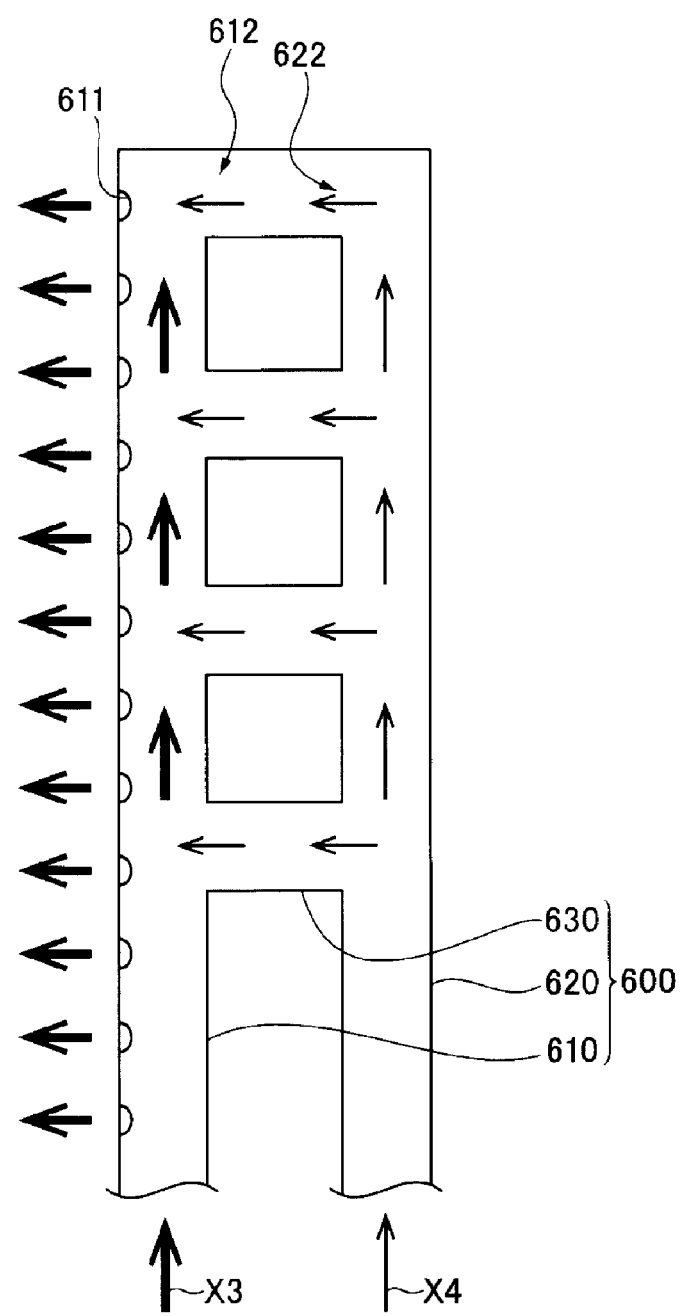
FIG. 6 is a schematic diagram showing another example of the gas introduction structure.

Another example of the raw material gas supply used in the thermal processing apparatus 1 will be described with reference to FIG. 6. FIG. 6 is a schematic diagram showing another example of the gas introduction structure.

The raw material gas supply 600 shown in FIG. 6 differs from the raw material gas supply 100 in that the raw material gas supply pipe 610 and the dilution gas supply pipe 620 are connected by a plurality of connection pipes 630.

The raw material gas supply 600 includes a raw material gas supply pipe 610, a dilution gas supply pipe 620 and a plurality of connection pipes 630.

The raw material gas supply pipe 610 is a nozzle that supplies a processing gas into the inner tube 44, and is provided inside the inner tube 44 to extend along the longitudinal direction thereof. The raw material gas is introduced into the raw material gas supply pipe 610 from the lower end toward the upper end as indicated by an arrow X3 in FIG. 6. The raw material gas supply pipe 610 has a plurality of gas discharge holes 611 and a plurality of connection ports 612.

The gas discharge holes 611 are formed at predetermined intervals along the longitudinal direction of the inner tube 44. When the raw material gas is introduced into the raw material gas supply pipe 610, the gas discharge holes 611 horizontally discharge the raw material gas into the inner tube 44.

The connection ports 612 are openings formed at a plurality of vertical positions facing the dilution gas supply pipe 620 including at least the upper portion of the raw material gas supply pipe 610. Each of the connection ports 612 is formed, for example, in a circular shape. One end of each of the connection pipes 630 is connected to each of the connection ports 612.

The dilution gas supply pipe 620 is a nozzle that supplies a dilution gas to the raw material gas supply pipe 610, and is provided inside the inner tube 44 to extend along the longitudinal direction thereof. For example, the dilution gas supply pipe 620 is arranged side by side with respect to the raw material gas supply pipe 610 along the circumferential direction of the inner tube 44. The dilution gas is introduced into the dilution gas supply pipe 620 from the lower end toward the upper end thereof as indicated by an arrow X4 in FIG. 6. The dilution gas supply pipe 620 has a plurality of connection ports 622.

The connection ports 622 are openings formed at a plurality of vertical positions facing the raw material gas supply pipe 610 including at least the upper portion of the dilution gas supply pipe 620. The other ends of the connection pipes 630 are connected to the connection ports 622, respectively.

The connection pipes 630 are members that connect the raw material gas supply pipe 610 with the dilution gas supply pipe 620, and bring the inside of the raw material gas supply pipe 610 into communication with the inside of the dilution gas supply pipe 620. The connection pipes 630 are provided along the longitudinal direction of the raw material gas supply pipe 610. One end of each of the connection pipes 630 is connected to each of the connection ports 612, and the other end thereof is connected to each of the connection ports 622.

By the raw material gas supply 600, the dilution gas is supplied to at least the upper portion of the raw material gas supply pipe 610 from the dilution gas supply pipe 620 through the connection pipes 630. Therefore, the staying of the raw material gas in the upper portion of the raw material gas supply pipe 610 is suppressed. This makes it possible to suppress deposition of a film inside the raw material gas supply pipe 610. As a result, it is possible to reduce generation of particles due to film peeling inside the raw material gas supply pipe 610. Furthermore, by suppressing the staying of the raw material gas in the upper portion of the raw material gas supply pipe 610, it is possible to reduce the concentration of the raw material gas in the upper portion of the raw material gas supply pipe 610. As a result, the variation in the concentration of the raw material gas in a range from the upper portion to the lower portion of the raw material gas supply pipe 610 is reduced, whereby the gas can be uniformly supplied from the gas discharge holes 611.

A further example of the raw material gas supply used in the thermal processing apparatus 1 will be described with reference to FIG. 7. FIG. 7 is a schematic diagram showing a further example of the gas introduction structure.

The raw material gas supply 700 shown in FIG. 7 differs from the raw material gas supply 100 in that the raw material gas supply pipe 710 and the dilution gas supply pipe 720 are connected to each other through the slit-shaped connection ports 712 and 722 vertically extending along the raw material gas supply pipe 710 and the dilution gas supply pipe 720.

The raw material gas supply 700 includes a raw material gas supply pipe 710, a dilution gas supply pipe 720 and a connection slit 730.

The raw material gas supply pipe 710 is a nozzle that supplies a processing gas into the inner tube 44, and is provided inside the inner tube 44 to extend along the longitudinal direction thereof. The raw material gas is introduced into the raw material gas supply pipe 710 from the lower end toward the upper end thereof as indicated by an arrow X5 in FIG. 7. The raw material gas supply pipe 710 has a plurality of gas discharge holes 711 and a connection port 712.

The gas discharge holes 711 are formed at predetermined intervals along the longitudinal direction of the inner tube 44. When the raw material gas is introduced into the raw material gas supply pipe 710, the gas discharge holes 711 horizontally discharge the raw material gas into the inner tube 44.

The connection port 712 is an opening formed in the upper portion of the raw material gas supply pipe 710 at a position facing the dilution gas supply pipe 720. The connection port 712 is formed, for example, in a slit shape extending in the vertical direction of the raw material gas supply pipe 710. One end of the connection slit 730 is connected to the connection port 712.

The dilution gas supply pipe 720 is a nozzle that supplies a dilution gas to the raw material gas supply pipe 710, and is provided inside the inner tube 44 to extend along the longitudinal direction thereof. For example, the dilution gas supply pipe 720 is arranged side by side with respect to the raw material gas supply pipe 710 along the circumferential direction of the inner tube 44. The dilution gas is introduced into the dilution gas supply pipe 720 from the lower end toward the upper end thereof as indicated by an arrow X6 in FIG. 7. The dilution gas supply pipe 720 has a connection port 722.

The connection port 722 is an opening formed in the upper portion of the dilution gas supply pipe 720 at a position facing the raw material gas supply pipe 710. The connection port 722 is formed, for example, in a slit shape extending in the vertical direction of the dilution gas supply pipe 720. The other end of the connection slit 730 is connected to the connection port 722.

The connection slit 730 is a member that connects the raw material gas supply pipe 710 and the dilution gas supply pipe 720, and brings the inside of the raw material gas supply pipe 710 into communication with the inside of the dilution gas supply pipe 720. One end of the connection slit 730 is connected to the connection port 712, and the other end thereof is connected to the connection port 722.

By the raw material gas supply 700, the dilution gas is supplied to at least the upper portion of the raw material gas supply pipe 710 from the dilution gas supply pipe 720 through the connection slit 730. Therefore, the staying of the raw material gas in the upper portion of the raw material gas supply pipe 710 is suppressed. This makes it possible to suppress deposition of a film inside the raw material gas supply pipe 710. As a result, it is possible to reduce generation of particles due to film peeling inside the raw material gas supply pipe 710. Furthermore, by suppressing the staying of the raw material gas in the upper portion of the raw material gas supply pipe 710, it is possible to reduce the concentration of the raw material gas in the upper portion of the raw material gas supply pipe 710. As a result, the variation in the concentration of the raw material gas in a range from the upper portion to the lower portion of the raw material gas supply pipe 710 is reduced, whereby the gas can be uniformly supplied from the gas discharge holes 711.

[Simulation Experiment]

Next, simulation experiments conducted to confirm the effects of the gas introduction structure of the embodiment will be described. FIGS. 8A to 8G are views for explaining gas introduction structures used for simulation experiments.

In simulation experiment 1, when a hexachlorodisilane (HCD) gas, which is a raw material gas, is supplied into the processing container by using seven raw material gas supplies A to G (see FIGS. 8A to 8G) as gas introduction structures, the relationship between the height positions of the raw material gas supplies A to G and the mole fraction of SiCl$_2$ was evaluated. The parameters used in simulation experiment 1 are as follows.

Temperature in processing container: 630 degrees C.
Pressure in processing container: 0.4 Torr (53 Pa)
Gas introduced into raw material gas supply pipe: HCD/N$_2$ (300/5000 sccm)
Gas introduced into dilution gas supply pipe: N$_2$ (1000 sccm)

The raw material gas supply shown in FIG. 8A is formed only by the raw material gas supply pipe A1 (inner diameter 16 mm). 170 gas discharge holes (hole diameter 1.2 mm) are formed in the raw material gas supply pipe A1 along the longitudinal direction thereof.

Figure 8B:
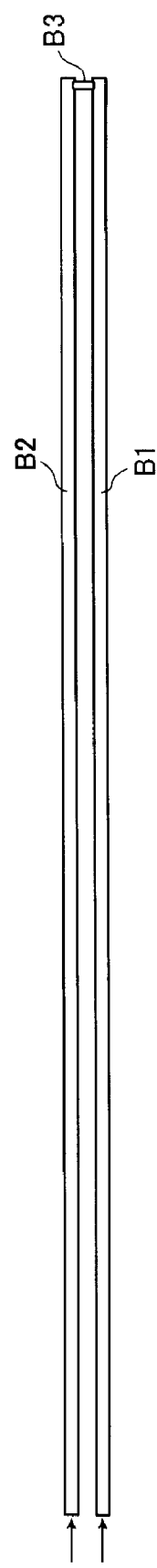

The raw material gas supply shown in FIG. 8B includes a raw material gas supply pipe B1 (inner diameter 16 mm), a dilution gas supply pipe B2 (inner diameter 16 mm) and a connection pipe B3 (inner diameter 10 mm). As in the raw material gas supply pipe A1, 170 gas discharge holes (hole diameter 1.2 mm) are formed in the raw material gas supply pipe B1 along the longitudinal direction thereof. The raw material gas supply pipe B1 and the dilution gas supply pipe B2 are connected by the connection pipe B3 at one location near the upper end.

Figure 8C:
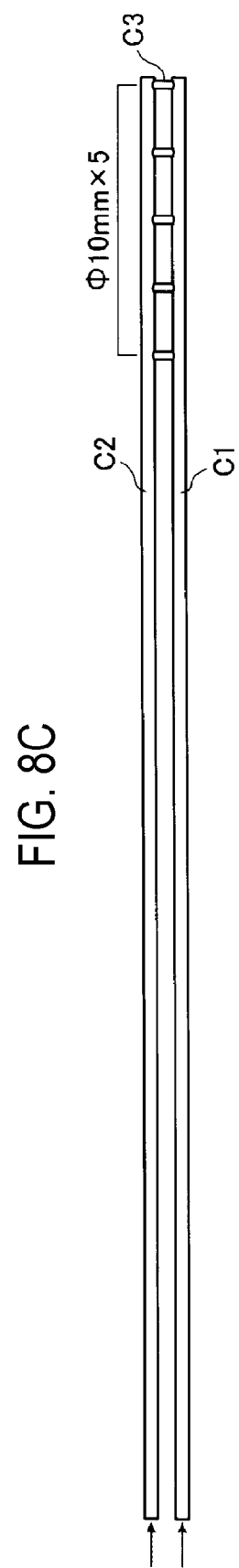

The raw material gas supply shown in FIG. 8C includes a raw material gas supply pipe C1 (inner diameter 16 mm), a dilution gas supply pipe C2 (inner diameter 16 mm) and five connection pipes C3 (inner diameter 10 mm). As with the raw material gas supply pipe A1, 170 gas discharge holes (hole diameter 1.2 mm) are formed in the raw material gas supply pipe C1 along the longitudinal direction thereof. The raw material gas supply pipe C1 and the dilution gas supply pipe C2 are connected by the connection pipes C3 at five upper locations including one location near the upper end.

Figure 8D:
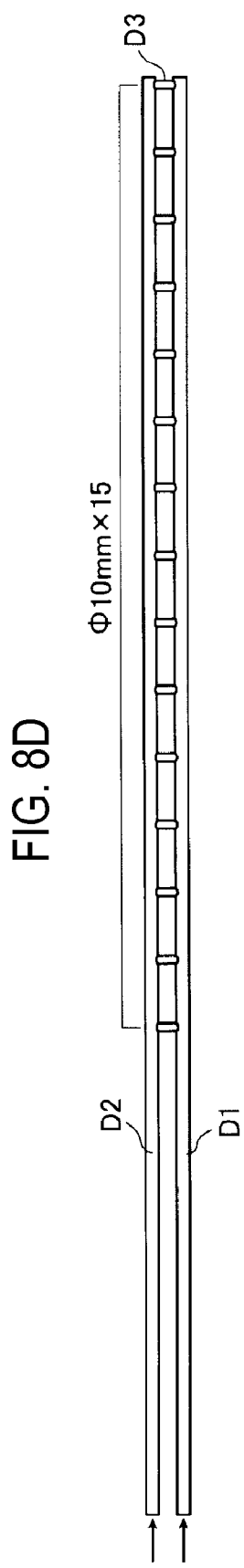

The raw material gas supply shown in FIG. 8D includes a raw material gas supply pipe D1 (inner diameter 16 mm), a dilution gas supply pipe D2 (inner diameter 16 mm) and 15 connection pipes D3 (inner diameter 10 mm). As with the raw material gas supply pipe A1, 170 gas discharge holes (hole diameter 1.2 mm) are formed in the raw material gas supply pipe D1 along the longitudinal direction thereof. The raw material gas supply pipe D1 and the dilution gas supply pipe D2 are connected by the connection pipes D3 at 15 locations in a range from the upper portion to the central portion, including one location near the upper end.

Figure 8E:
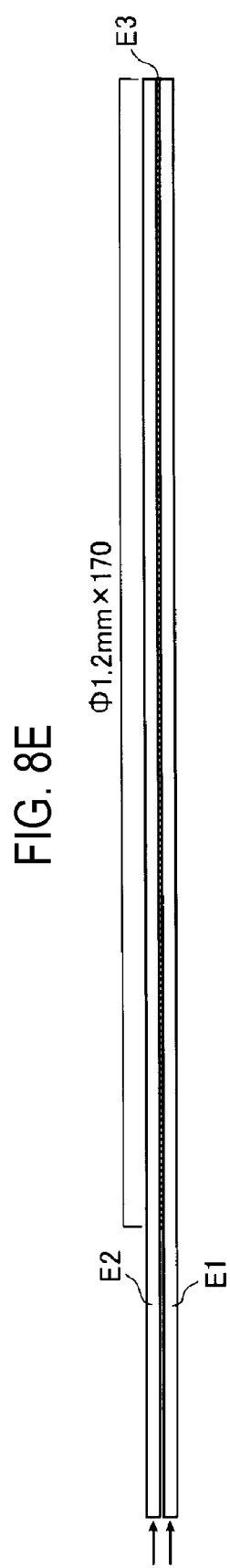

The raw material gas supply shown in FIG. 8E includes a raw material gas supply pipe E1 (inner diameter 16 mm), a dilution gas supply pipe E2 (inner diameter 16 mm) and 170 connection pipes E3 (inner diameter 1.2 mm). As with the raw material gas supply pipe A1, 170 gas discharge holes (hole diameter 1.2 mm) are formed in the raw material gas supply pipe E1 along the longitudinal direction thereof. The raw material gas supply pipe E1 and the dilution gas supply pipe E2 are connected by the connection pipes E3 at 170 locations in a range from the upper portion to the lower portion, including one location near the upper end.

Figure 8F:
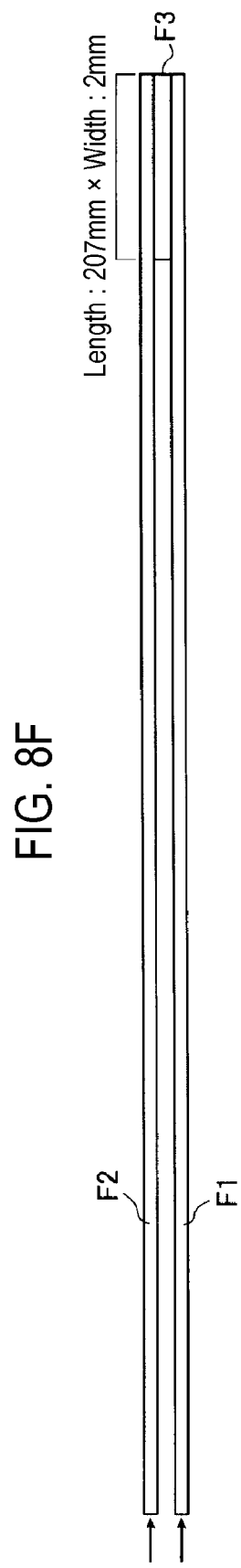

The raw material gas supply shown in FIG. 8F includes a raw material gas supply pipe F1 (inner diameter 16 mm), a dilution gas supply pipe F2 (inner diameter 16 mm) and a connection portion F3 (length 207 mm and width 2 mm). As with the raw material gas supply pipe A1, 170 gas discharge holes (hole diameter 1.2 mm) are formed in the raw material gas supply pipe F1 along the longitudinal direction thereof. The raw material gas supply pipe F1 and the dilution gas supply pipe F2 are connected by the connection portion F3 in a range having a length of 207 mm from the upper end.

The raw material gas supply shown in FIG. 8G includes a raw material gas supply pipe G1 (inner diameter 16 mm), a dilution gas supply pipe G2 (inner diameter 16 mm) and a connection portion G3 (length 1277 mm and width 2 mm). As with the raw material gas supply pipe A1, 170 gas discharge holes (hole diameter 1.2 mm) are formed in the raw material gas supply pipe G1 along the longitudinal direction thereof. The raw material gas supply pipe G1 and the dilution gas supply pipe G2 are connected by the connection portion G3 in a range having a length of 1277 mm from the upper end.

Figure 9:
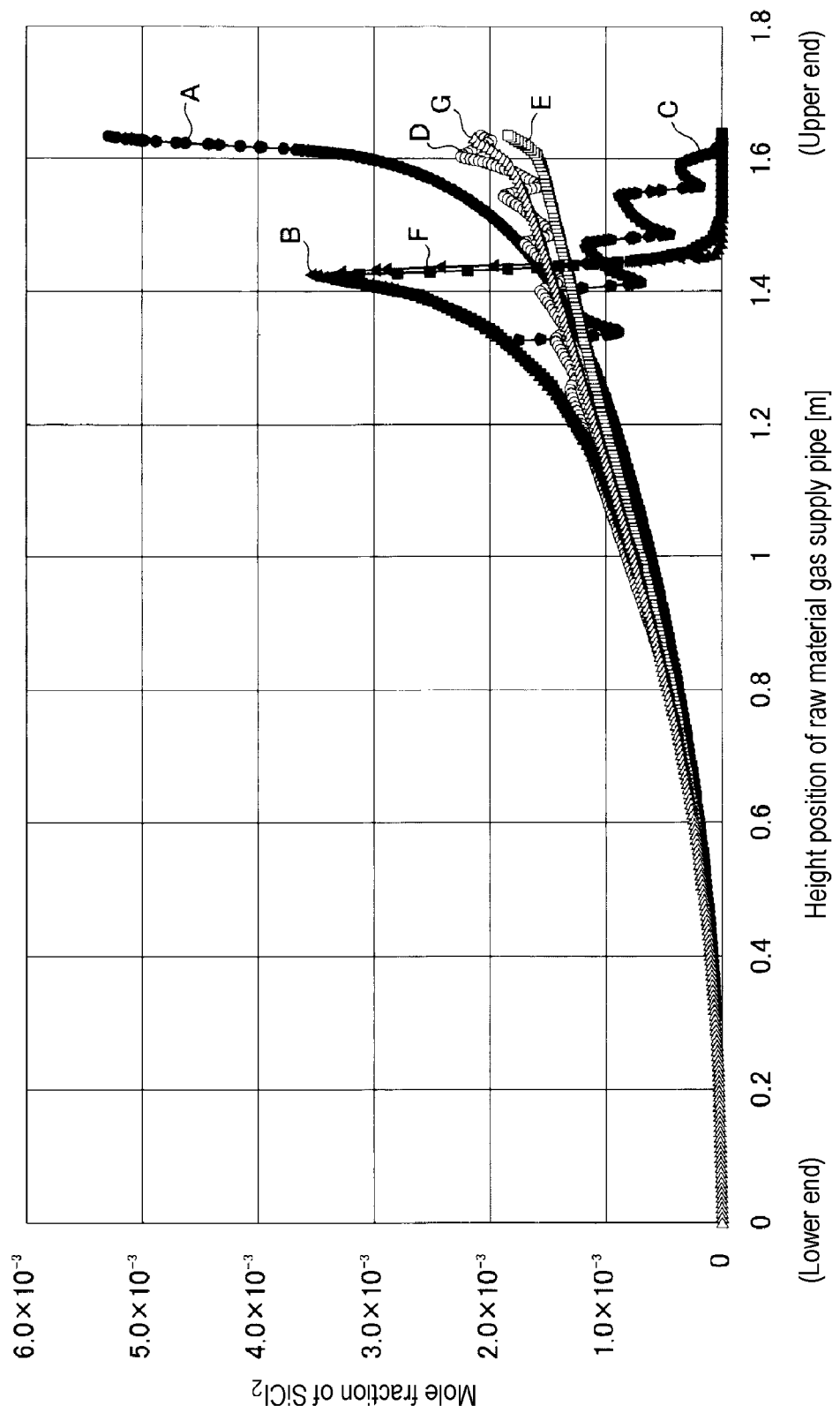
FIG. 9 is a view showing the results of simulation experiment 1.

FIG. 9 is a view showing the results of simulation experiment 1, which indicates the relationship between the height position of each of the raw material gas supplies A to G and the mole fraction of SiCl$_2$ when an HCD gas is supplied into the processing container using the seven raw material gas supplies A to G (see FIGS. 8A to 8G). In FIG. 9, the horizontal axis represents the height position 1 ml of the raw material gas supply pipe, the position 0 m represents the lower end of each of the raw material gas supplies A to G, and the position 1.62 m represents the upper end of each of the raw material gas supplies A to G. In addition, the vertical axis in FIG. 9 represents the mole fraction of SiCl$_2$.

As shown in FIG. 9, it can be seen that in the raw material gas supply A, the mole fraction of SiCl$_2$ is rapidly increasing at the upper end position. On the other hand, in the raw material gas supplies B to G, it can be noted that the rapid increase in the mole fraction of SiCl$_2$ at the upper end position is suppressed. From these results, it is considered that by supplying the dilution gas to at least the upper portion of the raw material gas supply, it is possible to suppress the staying of the raw material gas in the upper portion of the raw material gas supply pipe. Furthermore, it can be seen that in the raw material gas supplies C to E and G, the maximum value of the mole fraction of SiCl$_2$ in the range from the lower end to the upper end is particularly small.

In simulation experiment 2, when an HCD gas, which is a raw material gas, is supplied into the processing container by using the raw material gas supplies A and B (see FIGS. 8A to 8G) as gas introduction structures, the relationship between the height positions of the raw material gas supplies A and B and the mole fraction of SiCl$_2$ was evaluated. In simulation experiment 2, the flow rate of the N$_2$ gas, which is the dilution gas supplied from the dilution gas supply pipe to the raw material gas supply pipe at the time of using the raw material gas supply B, was set to 100 sccm, 500 sccm and 1000 sccm. The parameters used in simulation experiment 1 are as follows.

Temperature in processing container: 630 degrees C.
Pressure in processing container: 0.4 Torr (53 Pa)
Gas introduced into raw material gas supply pipe: HCD/N$_2$ (300/5000 sccm)
Gas introduced into dilution gas supply pipe: N$_2$ (100, 500 and 1000 sccm)

Figure 10:
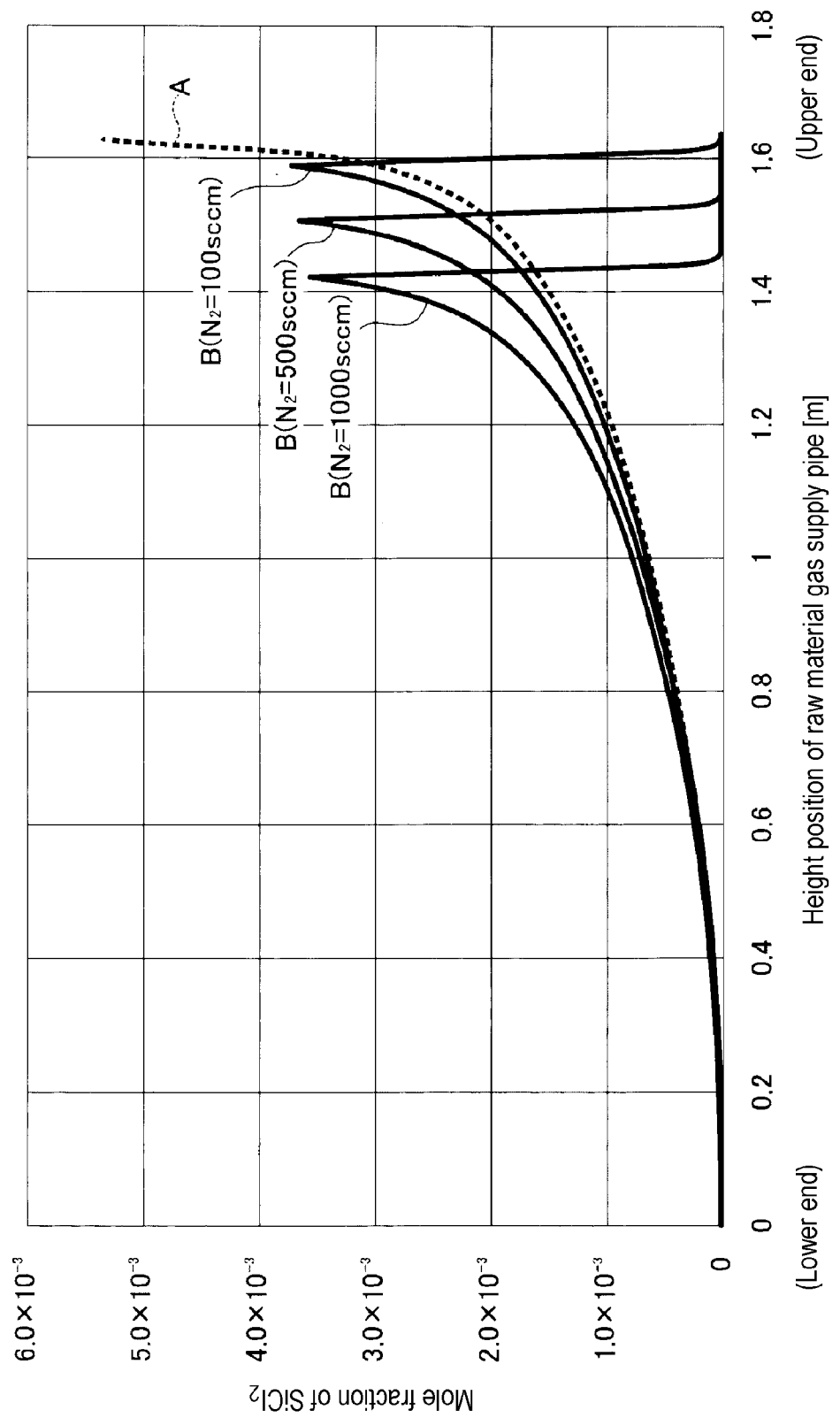
FIG. 10 is a view showing the results of simulation experiment 2.

FIG. 10 is a view showing the results of simulation experiment 2, which indicates the relationship between the height position of each of the raw material gas supplies A and B and the mole fraction of SiCl$_2$ when an HCD gas is supplied into the processing container using the raw material gas supplies A and B (see FIGS. 8A to 8G). In FIG. 10, the horizontal axis represents the height position 1 ml of the raw material gas supply pipe, the position 0 m represents the lower end of each of the raw material gas supplies A and B, and the position 1.62 m represents the upper end of each of the raw material gas supplies A and B. In addition, the vertical axis in FIG. 10 represents the mole fraction of SiCl$_2$.

As shown in FIG. 10, it can be seen that by changing the flow rate of the N$_2$ gas introduced into the dilution gas supply pipe B2, it is possible to shift the height position indicating the maximum value of the mole fraction of $SiCl_2$ in the range from the lower end to the upper end. From this result, it is considered that the concentration distribution of the raw material gas in the height direction can be adjusted by adjusting the flow rate of the dilution gas supplied to the raw material gas supply.

In the above-described embodiment, the raw material gas supplies 100, 600 and 700 are examples of the gas introduction structure. The raw material gas supply pipes 110, 610 and 710 are examples of the processing gas supply pipe. The connection pipes 130 and 630 and the connection slit 730 are examples of the connection portion. In addition, the wafer W is an example of the substrate.

The embodiment disclosed herein is to be considered as illustrative and not limitative in all respects. The above-described embodiment may be omitted, replaced or modified in various forms without departing from the scope and spirit of the appended claims.

In the above-described embodiment, there has been illustrated the case where the raw material gas supply pipe 110 is provided in the inner tube 44 to extend along the longitudinal direction thereof, and the lower end of the raw material gas supply pipe 110 is bent in an L shape and is supported so as to penetrate the manifold 54. However, the present disclosure is not limited thereto. For example, the raw material gas supply pipe 110 may be provided in the inner tube 44 to extend along the longitudinal direction thereof and may have a straight pipe shape in which the lower end thereof is supported by the manifold 54. The dilution gas supply pipe 120 and the reaction gas supply pipe 210 are the same as the raw material gas supply pipe 110.

In the above-described embodiment, there has been illustrated the case where the raw material gas supply 100 includes the raw material gas supply pipe 110, the dilution gas supply pipe 120 and the connection pipe 130 that connects the raw material gas supply pipe 110 and the dilution gas supply pipe 120. However, the present disclosure is not limited thereto. For example, the reaction gas supply 200 may have the same configuration as the raw material gas supply 100. That is, the reaction gas supply 200 may be configured to include a reaction gas supply pipe, a dilution gas supply pipe and a connection pipe that connects the reaction gas supply pipe and the dilution gas supply pipe.

In the above-described embodiment, the thermal processing apparatus has been described by taking, as an example, the cross-flow type apparatus in which the raw material gas supplied from the raw material gas supply 100 into the processing container 34 is exhausted through the opening 52 provided opposite to the raw material gas supply 100. However, the present disclosure is not limited thereto. For example, the thermal processing apparatus may be an upward exhaust type apparatus in which the raw material gas supplied from the raw material gas supply 100 into the processing container 34 is exhausted through a gas exhaust port provided in the ceiling of the processing container 34.

According to the present disclosure in some embodiments, it is possible to suppress deposition of a film inside a gas supply pipe and to uniformly supply a gas.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A gas introduction structure for supplying a processing gas into a vertically-elongated processing container, comprising:
a processing gas supply pipe connected to a supply source of a first gas consisting of the processing gas and extending along a vertical direction of the processing container in the processing container, the processing gas supply pipe configured so that the first gas is introduced from a lower end toward an upper end of the processing gas supply pipe;
a dilution gas supply pipe connected to a supply source of a second gas consisting of a dilution gas and extending along the vertical direction of the processing container in the processing container; and
a connection pipe configured to bring an inside of the processing gas supply pipe into communication with an inside of the dilution gas supply pipe to supply the second gas from the dilution gas supply pipe to the processing gas supply pipe, the connection pipe connecting at least an upper portion of the processing gas supply pipe that is closer to the upper end than the lower end of the processing gas supply pipe and the dilution gas supply pipe,
wherein the processing gas supply pipe is structured not to be connected to the supply source of the second gas upstream of the processing container,
wherein the dilution gas supply pipe is structured not to be connected to the supply source of the first gas upstream of the processing container,
wherein the processing gas supply pipe has a plurality of gas discharge holes formed along the vertical direction between the lower end and the upper portion, and is configured to supply the first gas diluted with the second gas through the gas discharge holes, and
wherein the second gas, which has been supplied from the dilution gas supply pipe via the connection pipe to the processing gas supply pipe, dilutes the first gas in the upper portion of the processing gas supply pipe.

2. The structure of claim 1, wherein the connection pipe is provided in plural numbers and the plurality of connection pipes is provided along the vertical direction of the processing gas supply pipe.

3. The structure of claim 1, wherein the connection pipe is formed in a pipe shape.

4. The structure of claim 1, wherein the connection pipe is formed to extend along the vertical direction of the processing gas supply pipe.

5. The structure of claim 1, wherein the processing gas supply pipe and the dilution gas supply pipe are arranged side by side along a circumferential direction of the processing container.

6. The structure of claim 1, wherein the processing gas is a raw material gas.

7. The structure of claim 6, wherein the raw material gas is introduced into the processing container heated to a temperature equal to or higher than a thermal decomposition temperature of the raw material gas through the processing gas supply pipe.

8. The structure of claim 1, wherein the dilution gas is an inert gas or a hydrogen gas.

9. The structure of claim 1, wherein a heater configured to heat the processing container is provided on an outer periphery side of the processing container.

10. The structure of claim 1, wherein the processing container is configured to accommodate a plurality of substrates held in a shelf shape by a substrate holder.

11. A thermal processing apparatus comprising:
a vertically-elongated processing container;
a gas introduction structure configured to supply a processing gas into the processing container;
an exhauster configured to exhaust the processing gas existing in the processing container; and
a heater arranged on an outer periphery side of the processing container,
wherein the gas introduction structure includes:
a processing gas supply pipe connected to a supply source of a first gas consisting of the processing gas and extending along a vertical direction of the processing container in the processing container, the processing gas supply pipe configured so that the first gas is introduced from a lower end toward an upper end of the processing gas supply pipe;
a dilution gas supply pipe connected to a supply source of a second gas consisting of a dilution gas and extending along the vertical direction of the processing container in the processing container; and
a connection pipe configured to bring an inside of the processing gas supply pipe into communication with an inside of the dilution gas supply pipe to supply the second gas from the dilution gas supply pipe to the processing gas supply pipe, the connection pipe connecting at least an upper portion of the processing gas supply pipe that is closer to the upper end than the lower end of the processing gas supply pipe and the dilution gas supply pipe,
wherein the processing gas supply pipe is structured not to be connected to the supply source of the second gas upstream of the processing container,
wherein the dilution gas supply pipe is structured not to be connected to the supply source of the first gas upstream of the processing container,
wherein the processing gas supply pipe has a plurality of gas discharge holes formed along the vertical direction between the lower end and the upper portion, and is configured to supply the first gas diluted with the second gas through the gas discharge holes, and
wherein the second gas, which has been supplied from the dilution gas supply pipe via the connection pipe to the processing gas supply pipe, dilutes the first gas in the upper portion of the processing gas supply pipe.

12. A gas supply method for supplying a processing gas into a vertically-elongated processing container that comprises:
a processing gas supply pipe that is connected to a supply source of a first gas consisting of the processing gas, extends along a vertical direction of the processing container in the processing container and has a plurality of gas discharge holes formed along the vertical direction, the processing gas supply pipe configured so that the first gas is introduced from a lower end toward an upper end of the processing gas supply pipe;
a dilution gas supply pipe connected to a supply source of a second gas consisting of a dilution gas and extending along the vertical direction of the processing container in the processing container; and
a connection pipe configured to bring an inside of the processing gas supply pipe into communication with an inside of the dilution gas supply pipe, the connection pipe connecting at least an upper portion of the processing gas supply pipe that is closer to the upper end than the lower end of the processing gas supply pipe and the dilution gas supply pipe,
the gas supply method comprising:
when the first gas is supplied from the processing gas supply pipe into the processing container, supplying the second gas from the dilution gas supply pipe through the connection pipe into the upper portion of the processing gas supply pipe,
wherein the processing gas supply pipe is structured not to be connected to the supply source of the second gas upstream of the processing container,
wherein the dilution gas supply pipe is structured not to be connected to the supply source of the first gas upstream of the processing container,
wherein the processing gas supply pipe has a plurality of gas discharge holes formed along the vertical direction between the lower end and the upper portion, and is configured to supply the first gas diluted with the second gas through the gas discharge holes, and
wherein the second gas, which has been supplied from the dilution gas supply pipe via the connection pipe to the processing gas supply pipe, dilutes the first gas in the upper portion of the processing gas supply pipe.

* * * * *